United States Patent
Park et al.

(10) Patent No.: US 8,696,921 B2
(45) Date of Patent: Apr. 15, 2014

(54) METHOD OF MANUFACTURING A SEMICONDUCTOR DEVICE

(75) Inventors: Jin-Ho Park, Yongin-si (KR); Gil-Heyun Choi, Seoul (KR); Byung-Lyul Park, Seoul (KR); Jong-Myeong Lee, Seongnam-si (KR); Zung-Sun Choi, Seoul (KR); Hye-Kyung Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 557 days.

(21) Appl. No.: 12/687,987

(22) Filed: Jan. 15, 2010

(65) Prior Publication Data

US 2010/0184294 A1  Jul. 22, 2010

(30) Foreign Application Priority Data

Jan. 16, 2009  (KR) ........................ 10-2009-0003558

(51) Int. Cl.
*H01L 21/302* (2006.01)

(52) U.S. Cl.
USPC .............. 216/67; 216/18; 216/71; 134/1.3; 134/22.1; 438/643; 438/644; 438/648; 438/694; 438/702; 438/710; 438/714; 438/729; 438/905; 438/906; 438/909

(58) Field of Classification Search
None
See application file for complete search history.

(56) References Cited

U.S. PATENT DOCUMENTS

| | | | | |
|---|---|---|---|---|
| 5,425,793 A * | 6/1995 | Mori et al. | ................... | 55/385.2 |
| 5,858,102 A | 1/1999 | Tsi | | |
| 6,214,751 B1 * | 4/2001 | Lee | ............................... | 438/800 |
| 6,274,058 B1 * | 8/2001 | Rajagopalan et al. | .......... | 216/67 |
| 6,416,584 B1 * | 7/2002 | Won et al. | ..................... | 118/715 |
| 6,869,641 B2 * | 3/2005 | Schmitt | ...................... | 427/248.1 |
| 7,005,372 B2 * | 2/2006 | Levy et al. | ..................... | 438/627 |
| 7,486,378 B2 * | 2/2009 | Aichi | .............................. | 355/30 |
| 7,883,601 B2 * | 2/2011 | Chang et al. | ............. | 156/345.48 |
| 7,897,008 B2 * | 3/2011 | Chang et al. | ................. | 156/345.3 |
| 8,282,850 B2 * | 10/2012 | Chang et al. | .................... | 216/67 |
| 2004/0013818 A1 * | 1/2004 | Moon et al. | ................... | 427/576 |
| 2004/0216670 A1 * | 11/2004 | Gutsche et al. | .............. | 118/715 |
| 2009/0035941 A1 * | 2/2009 | Park et al. | ..................... | 438/675 |

FOREIGN PATENT DOCUMENTS

KR  10-0422396  2/2004

* cited by examiner

*Primary Examiner* — Anita Alanko
(74) *Attorney, Agent, or Firm* — Myers Bigel Sibley & Sajovec, P.A.

(57) ABSTRACT

In a method of manufacturing a semiconductor device, a substrate is loaded to a process chamber having, unit process sections in which unit processes are performed, respectively. The unit processes are performed on the substrate independently from one another at the unit process sections under a respective process pressure. The substrate sequentially undergoes the unit processes at the respective unit process section of the process chamber. Cleaning processes are individually performed to the unit process sections, respectively, when the substrate is transferred from each of the unit process sections and no substrate is positioned at the unit process sections. Accordingly, the process defects of the process units may be sufficiently prevented and the operation period of the manufacturing apparatus is sufficiently elongated.

11 Claims, 6 Drawing Sheets

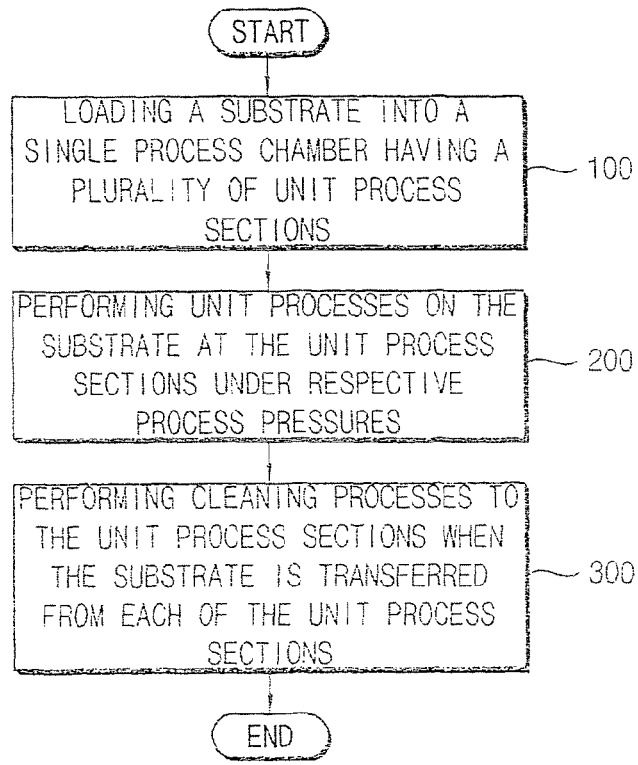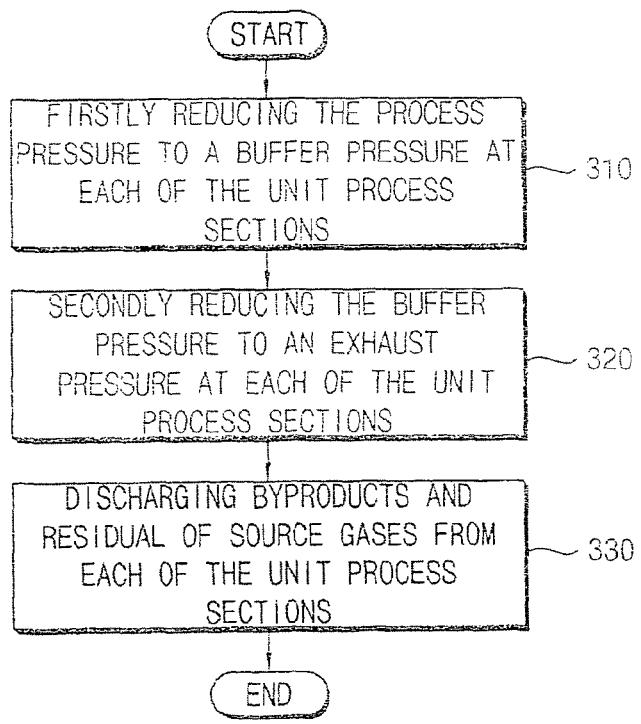

METHOD OF MANUFACTURING A SEMICONDUCTOR DEVICE

CROSS-REFERENCE TO RELATED APPLICATIONS

This application claims the benefit of Korean Patent Application No. 10-2009-0003558, filed on Jan. 16, 2009, in the Korean Intellectual Property Office, the disclosure of which is incorporated herein in its entirety by reference.

BACKGROUND

1. Field

Example embodiments relate to a method of manufacturing a semiconductor device.

2. Description of the Related Art

As semiconductor devices are becoming highly integrated, sizes of source/drain regions and width of gate electrodes and metal wiring in semiconductor devices are being, rapidly decreased. Thus, multi-layered wirings have been widely used as a wiring structure of the semiconductor device in which a number of wiring layers are sequentially stacked in a vertical direction and each of the wiring layers are electrically connected to each other by interconnections such as a contact plug.

In general, the wirings in a semiconductor device are electrically connected to underlying conductive structures such as transistors and are separated from each other by a number of insulation inter-layers. Then, the insulated upper and lower wirings are electrically connected to each other by the interconnections penetrating through the insulation interlayer. Recently, the interconnections may comprise a metal having low electrical resistance such as aluminum (Al), copper (Cu) and tungsten (W) as the high integration degree of the semiconductor device. Particularly, tungsten (W) has been much more widely used for the interconnection than any other metals because of high quality of step coverage and high pattern facilitation.

Metals are generally formed into the wiring structure for a semiconductor device by a deposition process and the deposition process usually requires chemical reactions at a high temperature. Thus, while performing the deposition process, various barrier layers are provided between the insulation interlayer and the interconnection for preventing the damage to the insulation interlayer and the underlying conductive structures.

Particularly, tungsten (W), which is now most widely used as a contact plug in a semiconductor device, has poor adherence to the insulation interlayer most of which comprises oxides. In addition, tungsten source gases in the deposition process usually cause damage to sidewalls of a contact hole or a via-hole. The barrier layer usually includes a glue layer for compensating the poor adherence to the insulation interlayer and an anti-diffusion layer for preventing fluorine ions (F—), byproducts of the fluorine source gases of the deposition process, from diffusing into the insulation interlayer. For example, a multilayered structure of titanium and titanium nitride (Ti/TiN), tungsten and tungsten nitride (W/WN) or tantalum and tantalum nitride (Ta/TaN) is widely used as the barrier layer. W/WN structure is used as the barrier layer because a tungsten (W) plug can be formed continuously with the W/WN barrier layer and a contact resistance between the barrier layer and the contact plug can be reduced.

Various deposition processes based on chemical reactions of source materials have been utilized for forming the WN layer that is conformal with the profile of the contact hole or the via hole and has high quality of step coverage.

Particularly, it has been suggested in U.S. patent application Ser. No. 12/183,421 by the assignee of this application that a number of unit processes for forming the barrier layer be performed in a single process chamber having a number of heaters in place of using a respective process chamber, which may prevent a vacuum break between consecutive unit processes caused by process chamber change to thereby increase layer quality.

For example, the glue layer, functioning as an ohmic layer in a wiring structure, is formed at a first process unit of a single process chamber and the anti-diffusion layer is formed at a second process unit of the single process chamber. Thereafter, the metal plug is formed at a third process unit of the same single process chamber by a deposition process to thereby complete the wiring structure for the semiconductor device.

However, various unit processes for forming the barrier layer are performed in the same single process chamber, thus the source gases for the respective unit process are difficult to supply into the single process chamber to thereby increase the sheet resistance of the deposited layer and to maintain thickness uniformity of the deposited layer.

SUMMARY

Example embodiments provide a method of manufacturing a semiconductor device in which the source gases for an each unit process is stably supplied into a single process chamber to thereby improve process reliability for formation of the barrier layer in the single process chamber.

According to some example embodiments, there is provided a method of manufacturing a semiconductor device. A substrate may be loaded into a single process chamber having a plurality of unit process sections in which a plurality of unit processes for manufacturing the semiconductor device are performed, respectively. The unit processes may be performed on the substrate independently from one another at the unit process sections under a respective process pressure, and thus the substrate sequentially undergoes the unit processes at the respective unit process section of the process chamber. Cleaning processes may be individually performed to the unit process sections, respectively, when the substrate is transferred from each of the unit process sections and no substrate is positioned at the unit process station.

In some example embodiments, the cleaning process to the unit process section may be performed by a first step of reducing the process pressure to an exhaust pressure lower than the process pressure at each of the unit process sections and a second step of discharging a residual of source gases and byproducts of the unit processes from each of the unit process sections. For example, the process pressure is in a range of about 0.1 Torr to about 350 Torr and the exhaust pressure is in a range of about 0.01 mTorr to about 3 mTorr.

In some example embodiments, the process pressure may be reduced to the exhaust pressure by a first step of changing the process pressure to a buffer pressure higher than the exhaust pressure and a second step of reducing the buffer pressure to the exhaust pressure. For example, the process pressure, the buffer pressure and the exhaust pressure are individually applied to each of the unit process sections by a pump system that is connected to each of the unit process sections. The buffer pressure may be in a range of about 0.5 mTorr to about 200 Torr.

In some example embodiments, the substrate includes a plurality of conductive structures, an insulation interlayer covering the conductive structures and a contact hole through which the conductive structures are partially exposed and the unit processes may be performed on the substrate as follows. A first unit process may be performed under a first process pressure at a first unit process section of the process chamber, to thereby form a first metal layer on a surface of the insulation interlayer and sidewalls and a bottom of the contact hole. Then, a second unit process may be performed under a second process pressure at a second unit process section of the process chamber, to thereby process the first metal layer. A third unit process may be performed under a third process pressure at a third unit process section of the process chamber, to thereby form a metal nitride layer on the processed first metal layer. A fourth unit process may be performed under a fourth process pressure at a fourth unit process section of the process chamber, to thereby form a second metal layer on the metal nitride layer to a thickness to fill up the contact hole. For example, the second unit process includes a nitration process for partially nitrating the first metal layer and an etching process for partially etching the first metal layer.

In some example embodiments, the cleaning, processes may be performed as follows. The first process pressure may be reduced to a first exhaust pressure at the first unit process section while the substrate is transferred to the second unit process section after the first unit process is finished at the first unit process section. The second process pressure may be reduced to a second exhaust pressure at the second unit process section while the substrate is transferred to the third unit process section after the second unit process is finished at the second unit process section. The third process pressure may be reduced to a third exhaust pressure at the third unit process section while the substrate is transferred to the fourth unit process section after the third unit process is finished at the third unit process section. The fourth process pressure may be reduced to a fourth exhaust pressure at the fourth unit process section while the substrate is unloaded from the process chamber after the fourth unit process is finished at the fourth unit process section. For example, the first to the fourth exhaust pressures may be substantially identical to one another and each of the process pressures are simultaneously reduced to the exhaust pressure at each of the unit process sections of the process chamber.

According to some example embodiments of the present inventive step, a plurality of unit processes may be individually performed on a substrate in the single process chamber at a process station while the substrate may be sequentially move into unit process sections corresponding to the unit processes, respectively, in the single process chamber, and a cleaning process may be individually performed to each of the unit process sections to thereby reduce process failures at each unit section of the process chamber and to increase operation period of an apparatus including the single process chamber.

BRIEF DESCRIPTION OF THE DRAWINGS

Example embodiments will be more clearly understood from the following detailed description taken in conjunction with the accompanying drawings.

FIG. 1 is a flow chart showing a method of manufacturing a semiconductor device in accordance with an example embodiment of the inventive concept;

FIG. 2 is a flow chart of a cleaning process shown in FIG. 1;

DETAILED DESCRIPTION OF THE EMBODIMENTS

Figure 3A:
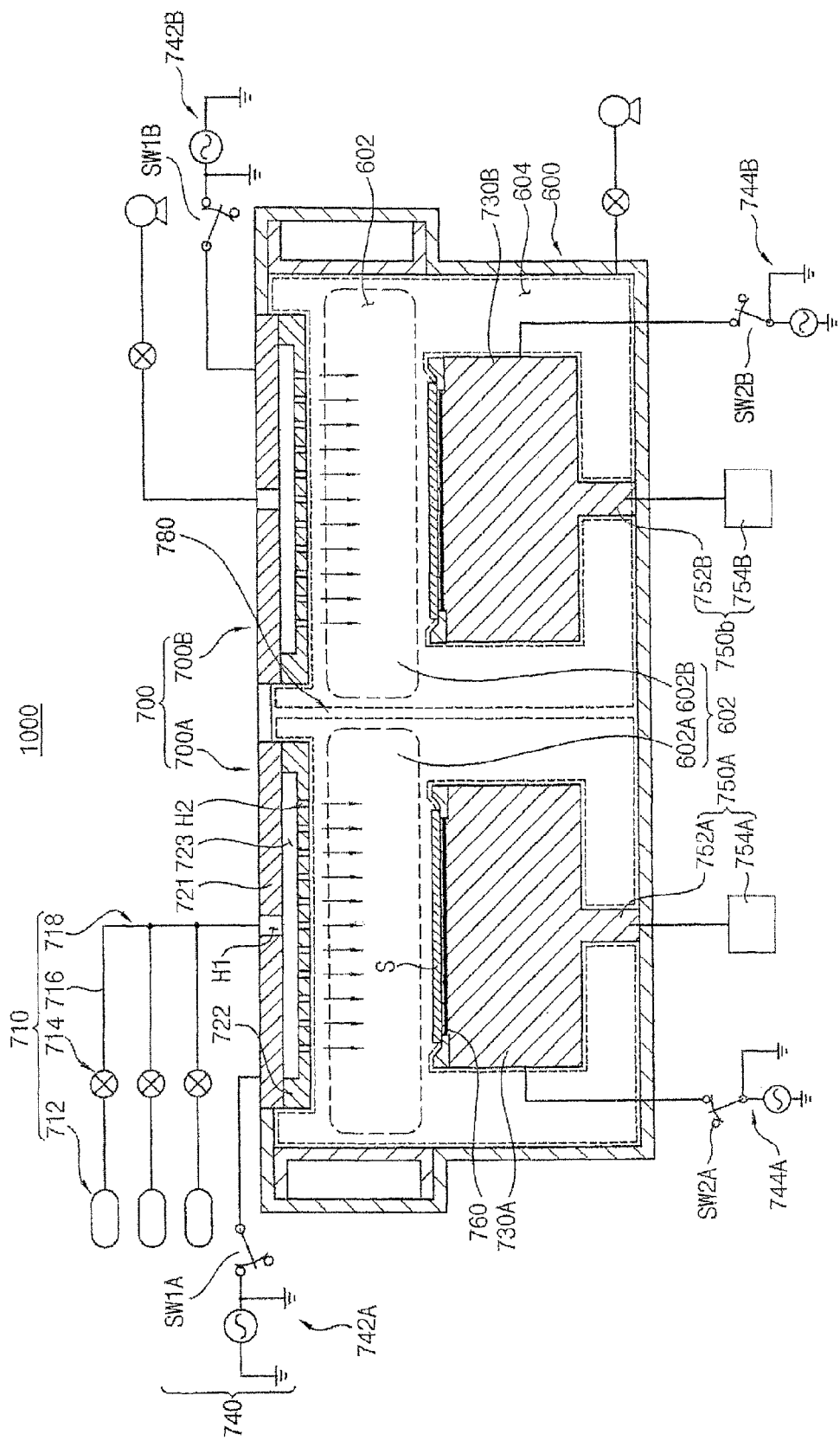
FIG. 3A is a cross sectional view illustrating an apparatus for manufacturing a semiconductor device in which different unit processes are performed in a single process chamber.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on, "connected to" or coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a flow chart showing a method of manufacturing a semiconductor device in accordance with an example embodiment of the inventive concept. FIG. 2 is a flow chart showing a cleaning process shown in FIG. 1.

Referring to FIG. 1, a substrate may be provided into a single process chamber having a plurality of unit process sections (100).

An inner space of the single process chamber may be separated by and allocated to the unit process sections and each unit process section may include a support on which a substrate may be positioned (a station) and a heater for heating the support. The heaters and the supports may function independently from each other and thus each unit process may be performed irrespective of other unit processes in the single process chamber.

For example, the single process chamber may include a deposition chamber for coating a thin layer on the substrate and a plurality of unit processes for the deposition process may be performed at each of the unit process sections under different process conditions. Therefore, various different layers may be formed on the substrate in the same single process chamber.

The substrate may include a semiconductor wafer for manufacturing a semiconductor device such as a DRAM device and a flash memory device.

Then, a plurality of unit processes may be performed on the substrate at the unit process sections of the process chamber while the substrate may be sequentially transformed into each of the unit process sections (step S200).

The substrate may sequentially move into the unit process sections and the unit processes may be performed on the same substrate at each of the unit process sections of the single process chamber under particular process conditions.

In an example embodiment, each of the unit process sections may be adapted for designed process conditions and the substrate may be processed at the unit process section under the designed process conditions. For example, the single process chamber may include a first section at which a first unit process may be performed on the substrate under a first pressure, a second section at which a second unit process may be performed on the substrate under a second pressure, a third section at which a third unit process may be performed on the substrate under a third pressure and a fourth section at which a fourth unit process may be performed on the substrate under a fourth pressure. Thus, the substrate may be sequentially transferred from the first section to the fourth section in the process chamber and the first, second, third and fourth unit processes may be performed on the same substrate at each section, respectively. Therefore, four different thin layers may be formed on the substrate in the single process chamber through the first to the fourth unit processes.

When each of the unit processes may be finished at each section in the single process chamber, the substrate may be transferred to the next unit process and a cleaning process may be performed to the unit process sections while transferring the substrate between the neighboring sections (step S300).

In an example embodiment, an inside of each unit process section may be depressurized in the single process chamber to an exhaust pressure much lower than a process pressure, to thereby exhaust residual materials from each unit process section. For example, a first exhaust pressure much lower than the first pressure may be applied to the first section of the single process chamber and thus the residual materials in the first section may be removed from the first section. The residual materials may include various byproducts of each unit process and source gases that are not reacted in each unit process in the single process chamber.

For example, four pump systems may be respectively connected to the first to fourth sections of the process chamber, and first to fourth exhaust pressures much lower than the process pressure of each section may be individually applied to each section of the process chamber. Particularly, the process pressure at each unit process section may be reduced to a buffer pressure (first depressurization, step S310) so as to facilitate the transfer of the substrate between the neighboring unit process sections and then the buffer pressure may be reduced to the exhaust pressure (second depressurization, step S320). Thereafter, the residual materials may be exhausted from each unit process section of the process chamber (step S330).

In an example embodiment, the process pressure at each unit process section may be in a range from about 0.1 Torr to about 350 Torr and the exhaust pressure at each unit process may be in a range from about 0.01 mTorr to about 3 mTorr. In addition, the buffer pressure may be in a range from about 0.5 mTorr to about 200 Torr. The exhaust of the residual materials from each unit process section may be caused by pressure difference between the exhaust pressure and a surrounding, pressure around the process chamber. Thus, the lower the exhaust pressure is, the more the residual materials are exhausted. However, as the exhaust pressure becomes lower, the pressure difference between the process pressure and the exhaust pressure at each process section and the large pressure difference between the process pressure and the exhaust pressure may have an impact on the substrate transfer between the neighboring sections in the single process chamber.

No buffer pressure may be needed in case that the pressure difference between the process pressure and the exhaust pressure may be sufficiently small and the buffer pressure may be preferably needed in case that the pressure difference between the process pressure and the exhaust pressure may be sufficiently large to have an impact on the substrate transfer. Accordingly, the depressurization of each unit process section may be performed once or twice in accordance with the pressure difference between the process pressure and the exhaust pressure. For example, when the depressurization may be twice in the unit process chamber, the process pressure may be firstly decreased to the buffer pressure and then the buffer pressure may be secondly decreased to the exhaust pressure.

While the present example embodiment discloses that the residual materials may be exhausted from the unit process sections by pressure difference, any other modifications known to one of ordinary skill in the art may be used for exhaust of the residual materials in place of or in conjunction with the pressure difference. For example, the modifications for exhausting the residual materials may include chemical reactions with the residual materials in the unit process section of the process chamber.

Hereinafter, a metal plug may be exemplarily described in detail as the wiring structure of the semiconductor device that is manufactured by the above method.

Figure 3B:
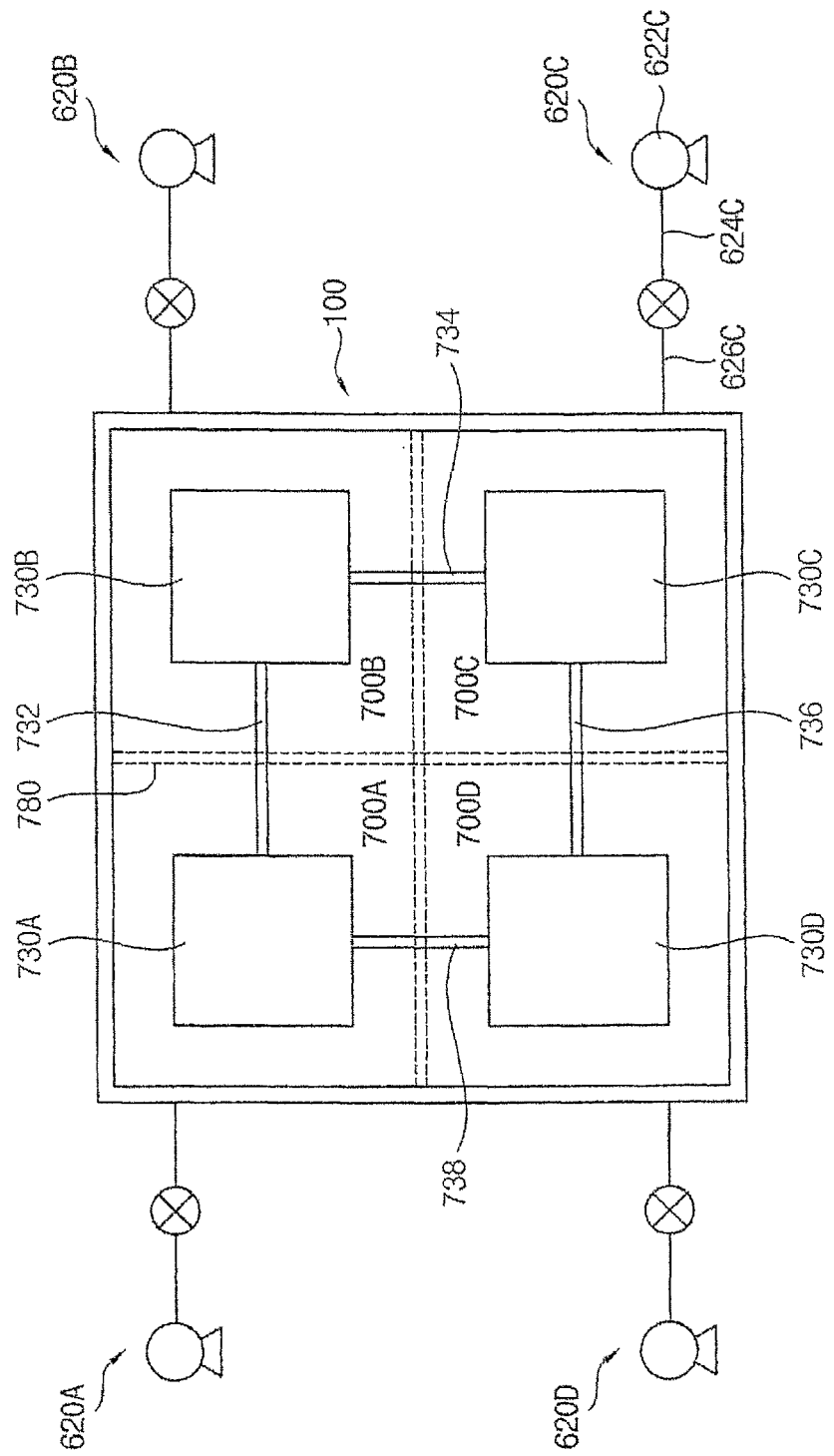
FIG. 3B is a plan view illustrating a bottom portion of the apparatus shown in FIG. 3A.

FIG. 3A is a cross sectional view illustrating an apparatus for manufacturing a semiconductor device in which different unit processes are performed in a single process chamber. FIG. 3B is a plan view illustrating a bottom portion of the apparatus shown in FIG. 3A and FIG. 3C is a view illustrating an upper portion of the apparatus shown in FIG. 3A.

Figure 3C:
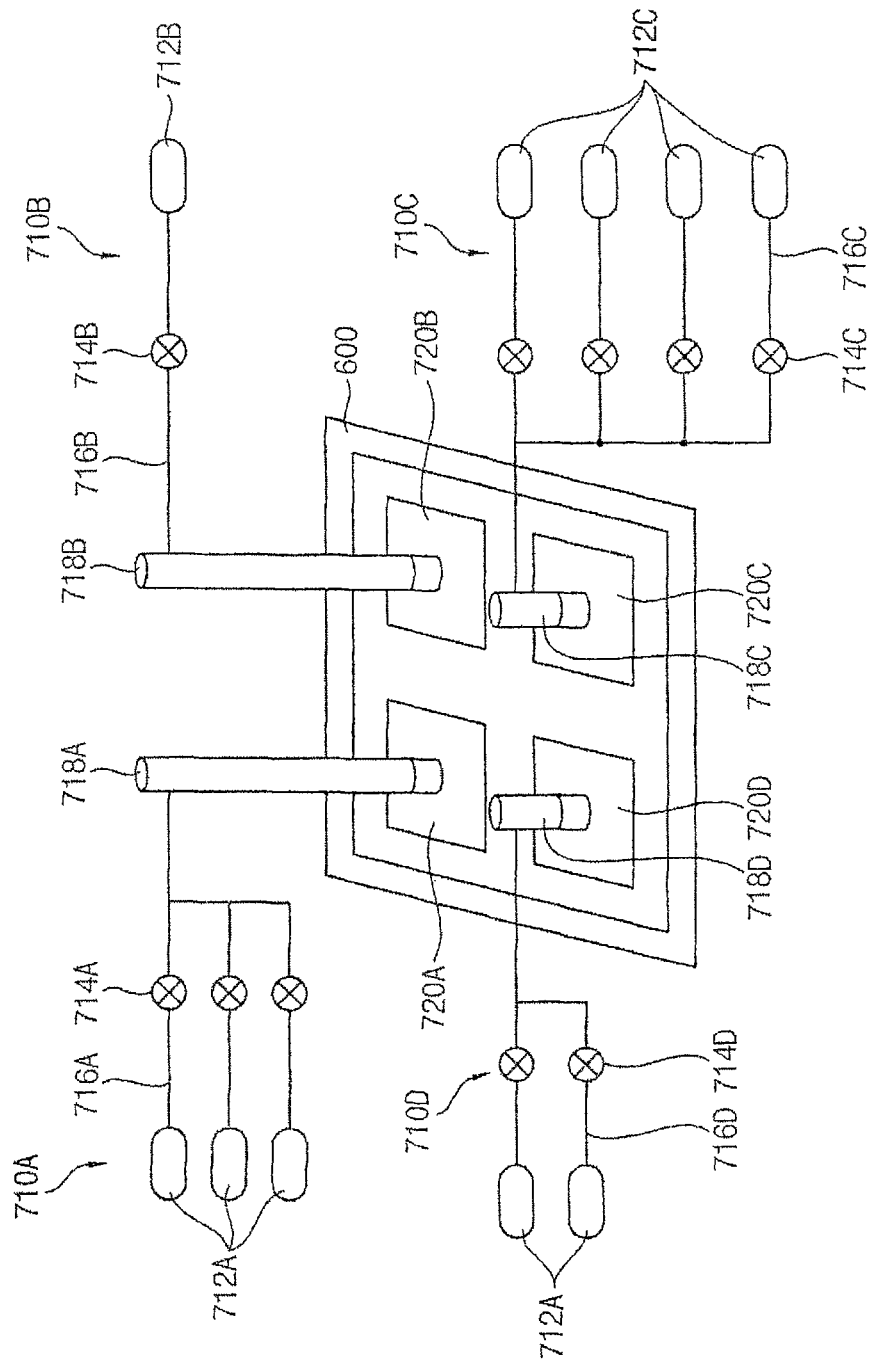
FIG. 3C is a view illustrating an upper portion of the apparatus shown in FIG. 3A.

The apparatus shown in FIGS. 3A to 3C may be illustrative of an example embodiment of the device for and the method of manufacturing a semiconductor in accordance with the present inventive concept and is not construed as limiting thereof. While the apparatus shown in FIGS. 3A to 3C may exemplarily disclose a single process chamber having a number of heaters and supports, the number and arrangement of the heaters and supports may be varied if different unit processes are performed in the same single process chamber.

Referring to FIGS. 3A to 3C, the apparatus 1000 for manufacturing a semiconductor device (referred to as manufacturing apparatus) may include a process chamber 600 in which various processes, which are different from one another, may be performed on a substrate S, a gas supplier 710 for supplying source gases for each process into the process chamber 600, a plurality of upper electrodes 720a, 720b, 720c, 720d that are arranged at an upper portion of the process chamber 600 and is connected to the gas supplier 710, a plurality of lower electrodes 730a, 730b, 730c, 730d that are arranged at a lower portion of the process chamber 600 and correspond one-to-one to the upper electrodes and first and second power source for supplying electrical power to the upper and lower electrodes, respectively.

In an example embodiment, a plurality of the gas suppliers 710 may be arranged in such a configuration that the upper electrodes may be individually connected a gas supplier 710, respectively. Each unit process may be performed in a space between the respective upper and lower electrodes and the sourced gases for each of the unit processes may be individually and independently supplied into the space between the lower and upper electrodes through the gas suppliers 710. Thus, each unit process may be performed in the space between the respective lower and upper using each source gases, to thereby form a plurality of unit process sections 700. In the present example, the unit process sections may be separated from each other by a variable barrier 780 and each of the unit processes may be individually and independently performed in the unit process sections 700, e.g., 700a and 700b, respectively.

In an example embodiment, the unit process sections 700 may include a first section 700a for performing a first unit process, a second section 700b for performing a second unit process, a third section 700c for performing a third unit process and a fourth section 700d for performing a fourth unit process.

Each of the unit process sections 700 may include the gas supplier 710 for supplying the source gases into the process chamber 600, the upper electrode 720 that is arranged at the upper portion of the process chamber 600 and is connected to the gas supplier 710, the lower electrode 730 facing the upper electrode 720 and the power source 740 for supplying electrical power to the upper and lower electrodes, respectively. The substrate S may be positioned on the lower electrode.

The process chamber 600 may include a closed inner space in which different unit processes may be performed on the substrate S. For example, the process chamber 600 may include an upper space 602 in which a manufacturing process is performed on the substrate S by the source gases and a lower space 604 from which a residual of the source gases and byproducts of the unit process are discharged. The lower space 604 may be connected to a pump system 620 for making the inner space of the process chamber 600 vacuous.

A number of the pump systems 620 may be installed to the unit process sections 700, respectively. In the present example embodiment, first to fourth pump systems 620a to 620d may be connected to the first to fourth unit process sections 700a-700d, respectively. Accordingly, the inner space of the process chamber 600 corresponding to the first to fourth unit process sections 700a-700d may be evacuated by the first to fourth pump systems 620a to 620d. While the present example embodiment discloses first to fourth pump systems connected to the unit process sections 700a-700d, respectively, a single pump system may be connected to the whole inner space of the process chamber 600, as would be known to one of the ordinary skill in the art.

For example, the pump system 620 may include a vacuum pump 622 for generating power for discharging the byproducts from the inner space of the process chamber 600, a discharge pipe 624 installed between the vacuum pump 622 and the inner space of the process chamber 600 and a regulation valve 626 for detecting and controlling an inner pressure of the process chamber 600. The pump system 620 may be operated at each of the unit process sections 700 independently from one another, so that the spaces of the each of the unit process sections 700a to 700d are individually brought into a vacuum.

Particularly, when the substrate S may be transferred into the neighboring unit process sections, the inner spaces of each of the unit process sections 700 may be brought into a vacuum to thereby discharge the residual of the source gases and the byproducts of each unit process. For example, the inner spaces of each of the unit process sections 700 may be depressurized to an exhaust pressure of about 0.01 mTorr to about 3 mTorr. That is, whenever the substrate S is transferred to the next unit process section, the residue of the source gases and the byproducts are discharged from each of the unit process sections 700, to thereby increase process reliability at each of the unit process sections 700. Therefore, the operation period of the apparatus 1.000 may be sufficiently elongated and thus the manufacturing efficiency may be remarkably increased in using the apparatus 1000.

The gas suppliers 710 may supply the source gases to each of the unit process sections 700 in the process chamber 600 in accordance with each unit process performed in each of the unit process sections 700. In the present example embodiment, first to fourth gas suppliers 710a to 710d may be installed one-to-one to the unit process sections 700a-700d. For example, the gas supplier 710 may include a gas reservoir 712 for individually holding source materials for the source gases corresponding to the unit process section 700, a control valve 714 for individually controlling the gas reservoir 712 to thereby regulate a flow rate of the source materials from the gas reservoir 712 and a connection pipe 716 for supplying the source materials to the unit process section 700 of the process chamber 600. The structures of each of the gas suppliers 710a to 710d may be different from one another in accordance with the unit processes that are to be performed in each of the unit process sections 700a to 700d, because the source gases supplied into each of the unit process sections 700a to 700d may be varied according to the desired process that are to be performed in each of the unit process sections 700a to 700d.

For example, a conductive structure and an insulation interlayer covering the conductive structure may be formed on the substrate S and a contact hole may be formed in the insulation interlayer to thereby expose the substrate S. A first metal layer may be formed along a profile of the surface of the contact hole in the first section 700a by a first deposition process, and a nitration process may be performed on the upper portion of the first metal layer in the second section 700b. Therefore, the upper portion of the first metal layer may be nitrated at an upper portion of the contact hole by the nitration process in the second section 700b. A metal nitride layer may be formed on the first metal layer of which the upper portion is nitrated along the profile of the surface of the contact hole by a second deposition process in the third section 700c. Then, a second metal layer may be formed in the contact hole by a third deposition process in the fourth section 700d to thereby fill up the contact hole with the second metal layer. Otherwise, the first deposition process for forming the first metal layer or the second deposition process for forming the metal nitride layer may also be performed in the second section 700b in place of or in conjunction with the first section 700a and the third section 700c.

For example, when an atomic layer deposition (ALD) process may be performed for formation of the first metal layer in the first section 700a, the first gas supplier 710a may include a number of gas reservoirs 712a for individually holding metal source gases, hydrogen source gas and purge gases. It should be understood that any number of gas reservoirs 712a can be used. For example, when a metal plasma process or a pulsed nucleation layer (PLN) process is performed for formation of the first metal layer in the first section 700a, the first gas supplier 710a may include a single gas reservoir 712a for holding plasma source gases or nucleation source gases, as would be known to those having ordinary skill in the art. When the nitration process may be performed in the second section 700b, the second gas supplier 710b may include a single gas reservoir 712b for holding nitrogen source gases. Further, when an ALD process may be performed for formation of the metal nitride layer in the third section 700c, the third gas supplier 710c may include a number of gas reservoirs 712c for individually holding metal source gases, hydrogen source gas and nitrogen source gas and purge gases. When a chemical vapor deposition (CVD) process may be performed for formation of the second metal layer in the fourth section 700d, the fourth gas supplier 710d may include a number of gas reservoirs 712d for individually holding metal source gases and carrier gases.

Each of the gas reservoirs 712a to 712d in each of the gas supplier 710a to 710d may be connected with the connection pipes 716a to 716d, respectively, that are joined to the supply pipe 718a to 718d connected to each of the unit process sections 700a to 700d. The control valve 714 may be installed to the connection pipe 716, to thereby control the flow rate of each of the source gases in each of the gas reservoirs 712a to 712d.

The first gas supplier 710a may include the gas reservoirs 712a, the connection pipes 716a connected to the gas reservoirs 712a, respectively, and the control valves 714a installed to the connection pipes 716a, respectively. The second gas supplier 710b may include the single gas reservoir 712b, the single connection pipe 716b connected to the gas reservoir 712b and the single control valve 714b installed to the connection pipe 716b. The third gas supplier 710c may include the gas reservoirs 712c, the connection pipes 716c connected to the gas reservoirs 712c, respectively, and the control valves 714c installed to the connection pipes 716c, respectively. The fourth gas supplier 710d may include the gas reservoirs 712d, the connection pipes 716d connected to the gas reservoirs 712d, respectively, and the control valves 714d installed to the connection pipes 716d, respectively.

The first to fourth supply pipes 718a to 718d may be connected to the first to fourth sections 700a to 700d, respectively, so that the source gases may be supplied to each of the sections from the corresponding gas reservoirs irrespective of any other gas suppliers 718. Each of the control valves 714 may individually control the flow rate of the source materials which are discharged from each of the gas reservoirs 712a to 712d to the corresponding connection pipes 716a to 716d.

In an example embodiment, a central control unit (CCU) may control the opening and closing of each control valve 714 in accordance with a sequential order of a manufacturing process in the process chamber 600.

The upper electrodes 720a to 720d may be positioned at the upper portion of the process chamber 600, and the lower electrodes 730a to 730d facing and corresponding one-to-one to the upper electrodes 720a to 720d may be arranged at the lower portion of the process chamber 600. The substrate S may be located on the surface of the lower electrode 730. Therefore, the gas suppliers 710a to 710d connected to the upper electrodes 720a to 720d and the lower electrodes 730a to 730d facing the upper electrodes 720 may be formed into the unit process sections 700a to 700d together with the upper electrodes 720, and each of the sections 700a to 700d partially occupies the inner space of the process chamber 600.

It should be understood that the upper electrodes 720a to 720d and the lower electrodes 730a to 730d may be formed in any suitable shape such as a rectangle and a disc. In the present example embodiment, the upper electrode 720 may be shaped into a disc and may include a first electrode 721 positioned at an upper portion of the process chamber 600 and connected to a power source 742 and a second electrode 722 having a disc shape correspondently to the first electrode 721. The second electrode 722 may be coupled to a bottom surface of the first electrode 721 and positioned adjacent to the upper space 602. The upper electrode 720 may be connected to or disconnected from the power source 742 by a first switch SW 1.

A first penetration hole H1 may be located at a central portion of the first electrode 721. The first penetration hole H1 may be connected to the supply pipe 718 of the gas supplier 710, and thus the source gases or the purge gases may be supplied to the inner space of the process chamber 600 through the first penetration hole H1. Further, a buffer space 723 may be formed between the first and the second electrodes 721 and 722, and thus the source gases and the purge gases may be temporarily stored in the buffer space 723 before being introduced into the inner space of the process chamber 600.

Second penetration holes H2 may be uniformly distributed on the second electrode 722. The source gases or the purge gases in the buffer space 723 may be uniformly supplied into the inner space of the process chamber 600 through the second penetration holes H2. A groove for forming the buffer space 723 is formed on an upper surface of the second electrode 722. While the present example embodiment discloses the upper electrode has a disk shape, any other modification known to one of ordinary skill in the art may be applied to the shape of the upper electrode. For example, the upper electrode may be modified into a coil shape.

In an example embodiment, the lower electrode 730 is positioned on the bottom of the process chamber 600 and the substrate S is located on the upper surface of the lower electrode 730 by a vacuum or an electrostatic force, which faces the upper electrode 720. Therefore, plasma is generated in the upper space 602 between the lower surface of the upper electrode 720 and the upper surface of the lower electrode 730, so that a portion of the upper space 602 between the lower surface of the upper electrode 720 and the upper surface of the lower electrode 730 may be referred to as a plasma space. In addition, the residual of the source gases and by-products of the unit process in the process chamber 600 are discharged from a lower space 604 between the bottom of the process chamber 600 and the upper surface of the lower electrode 730, and thus a portion of the lower space 604 between the bottom of the process chamber 600 and the upper surface of the lower electrode 730 may be referred to as a discharge space. A heat source 760 may be further interposed between the substrate S and the upper surface of the lower electrode 730, so that the temperature of the substrate S may be varied and controlled in accordance with process requirements in each of the processing, units 700. For example, the heat source 760 may include an electric heater for converting, electrical energy to heat energy.

A driving, unit 750 may be further installed to a lower portion of the lower electrode 730, and thus the lower electrode 730 may move upward and downward in the process chamber 600 by the driving unit 750. In an example embodiment, the driving unit 750 may include a first shaft 752 connected to the lower electrode 730 and a power source 754 electrically connected to the first shaft 752. For example, the power source 754 may apply rotation power to the first shaft 752 and the lower electrode 730 may move upward or downward as the first shaft 752 rotates with respect to a central axis thereof. For example, the first shaft 752 may include a support unit for supporting the lower electrode 730 and a power transfer unit for transferring, the rotation power to the support unit. The power transfer unit may include a bearing and a gear. The power source may include a motor for generating an electric rotation power.

When the first lower electrode 730a moves upward to the upper electrode 720a by the first driving shaft 752a in the first section 700a, the size of the first plasma space 602a is reduced. Therefore, the substrate S in the first section 700a may be prevented from being influenced by the source gases or the plasma in the second to fourth plasma spaces 602b, 602c and 602d although different unit processes may be individually performed in the second to fourth processing units 700b, 700c and 700d.

The power supplier 740 may individually supply electric power to the upper and lower electrodes 720 and 730 of each section 700. In an example embodiment, the power supplier 740 may include an electric power source 742 for generating the plasma from the process gases and a bias power source 744 for accelerating the plasma from the substrate S. For example, the bias power source 744 may apply a direct current (DC) bias or a radio frequency (RF) bias to the lower electrode 730. The electric power source 742 may be electrically connected to the first electrode 721 of the upper electrode 720 by the first switch SW1, and the bias power source 744 may be electrically connected to the lower electrode 730 by the second switch SW2. Therefore, the electric power source 742 and the bias power source 744 may be connected to the upper electrode 720 and the lower electrode 730 by the respective first and second switches SW1 and SW2 independently from each other, so that the electric power and the bias may be selectively and independently applied to the unit process sections 700 in accordance with the unit process that is to be performed.

A transfer unit may be arranged between the lower electrodes 730a to 730d of each section 700, and thus the substrate S may move onto the lower electrodes 730 or work station of the next section 700 along the transfer unit. For example, the transfer unit may include conveyor systems 732, 734, 736 and 738 installed between the neighboring two lower electrodes 730. When a unit process is completed on the substrate S in a unit process section, the substrate S is moved into the next unit process section according to a process sequence by the conveyor system.

For example, the substrate S may move in the process chamber 600 in a sequential order of first, second, third and fourth lower electrodes 730a, 730b, 730c and 730d, to thereby complete the manufacturing process in the process chamber 600. In case of forming the wiring structure for a semiconductor device, the first deposition process for forming the metal layer is performed in the first section 700a and the nitration process is performed in the second section 700b. The second deposition process for forming the metal nitride layer is performed in the third section 700c and a metal plug process is performed in the fourth section 700d. In such a case, the first to fourth unit process sections 700a to 700d may be separated from one another by a variable barrier 780. For example, the variable barrier 780 such as an air curtain and an argon curtain is arranged between the sections 700, to thereby sufficiently prevent the mixture of the source gases and improve the separation of the process conditions between each of the unit process sections 700.

Particularly, when the substrate S may move into the next unit process section 700, the space of each of the unit process sections 700 may be depressurized to the exhaust pressure to thereby perform a cleaning process for discharging the residual of the source gases and the byproducts of the respective unit process. Accordingly, the unit process reliability may be improved in each of the unit process sections 700 and thus the manufacturing efficiency may be significantly increased in using the apparatus 1000.

Figure 4:
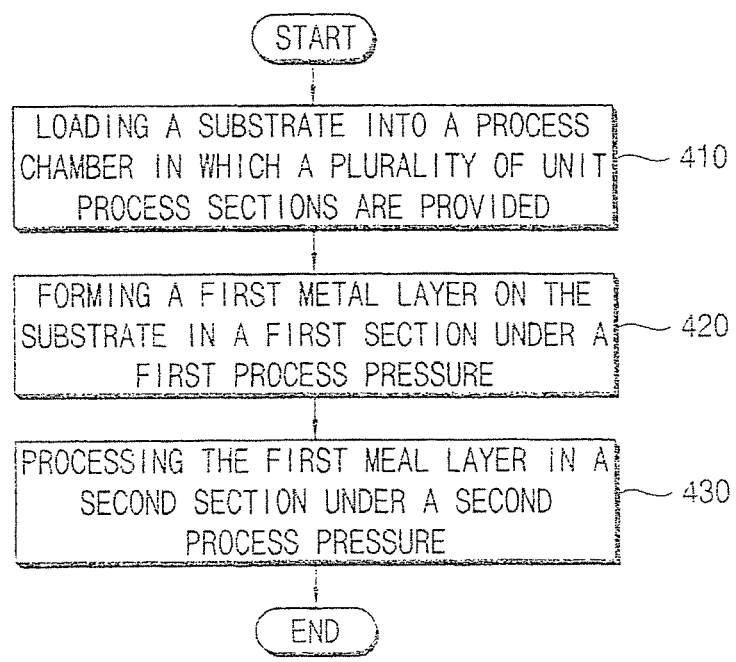
FIG. 4 is a flow chart showing processing steps for a method of manufacturing a semiconductor device in the manufacturing, apparatus shown in FIGS. 3A to 3C.
Figure 5:
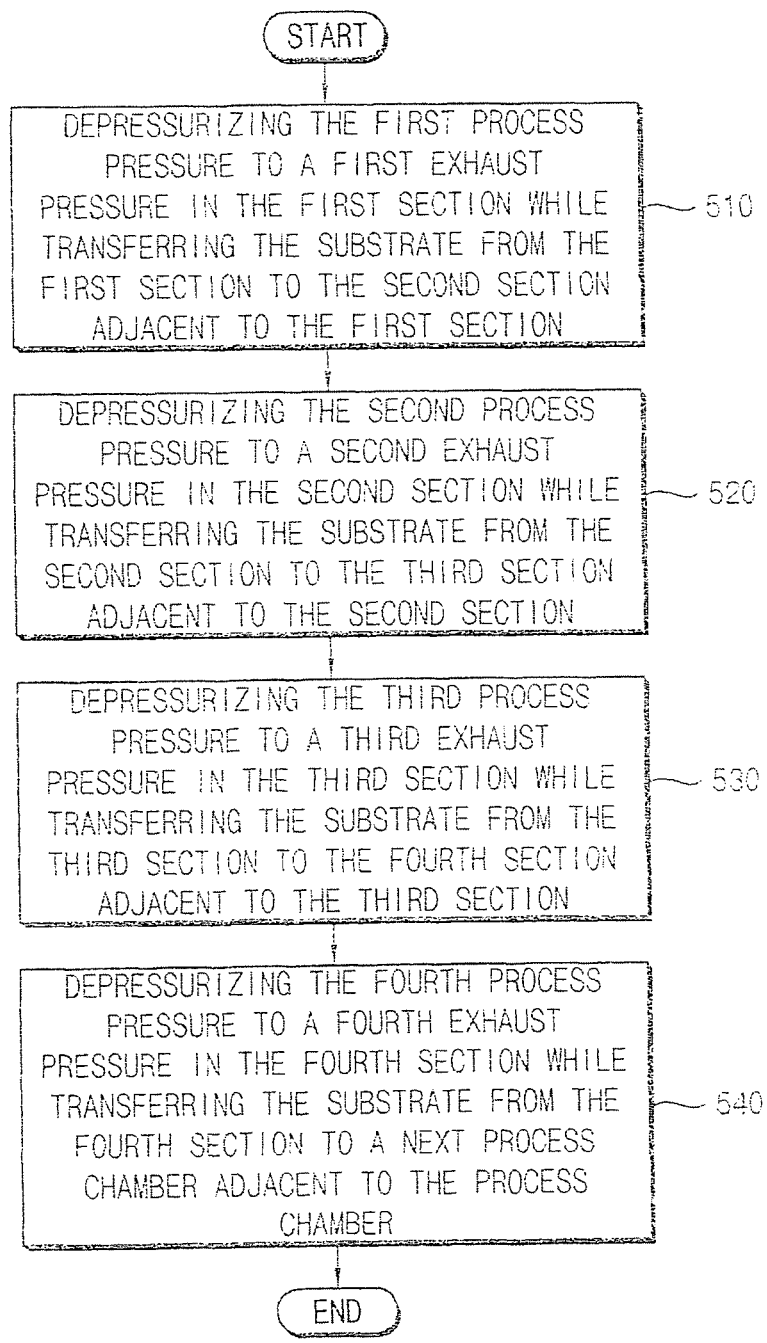
FIG. 5 is a flow chart showing the cleaning process shown in FIG. 1 in the manufacturing, apparatus shown in FIGS. 3A to 3C.

FIG. 4 is a flow chart showing processing steps for a method of manufacturing a semiconductor device in the manufacturing apparatus shown in FIGS. 3A to 3C and FIG. 5 is a flow chart showing the cleaning process shown in FIG. 1 in the manufacturing apparatus shown in FIGS. 3A to 3C.

Referring to FIGS. 3A to 3C and FIGS. 4 and 5, the substrate S may be loaded into the process chamber 600 in which the unit process sections 700 may be provided and is positioned on the first lower electrode 730a of the first section 700a.

At least one pattern may be formed on the substrate S and the pattern may include an insulation interlayer covering a plurality of conductive structures on the substrate S and a plurality of contact holes partially exposing the conductive structures penetrating through the insulation interlayer. In an example embodiment, the substrate S may be secured to the first lower electrode 730a by vacuum pressure and an electrostatic chuck.

Subsequently, a first metal layer may be formed on the pattern in the first unit process section under a first process pressure (step S420). For example, the inner pressure and temperature of the first section 700a is controlled to optimal conditions for the unit process in the first section 700a. Contaminants and residual materials are removed from the first section 700a by the first pump system 620a, and then the inner pressure of the first section 700a may be controlled to a first process pressure. In an example embodiment, the first process pressure may be varied in a range of about 0.1 Torr to about 350 Torr.

Subsequently, the heater may be operated in the first lower electrode 730a, and thereby the substrate S is heated to a first temperature in the first section 700a. For example, the first temperature may be varied in a range of about 250° C. to about 350° C. The first deposition process is performed on the substrate S as a first unit process in the first section 700a, to thereby form the first metal layer on the substrate S. In the present example embodiment, the first metal layer may include a tungsten (W) layer formed by an atomic layer deposition (ALD) process. Metal source gases and purge gases for the ALD process may be supplied into the first section 700a by the first gas supplier 710a. The metal source gases may include tungsten (W) precursors. Examples of the tungsten (W) precursors may include one of $WF_6$, $WCl_5$, $WBr_6$, $WCo_6$, $W(C_2H_2)_6$, $W(PF_3)_6$, $W(allyl)_4$, $(C_2H_5)WH_2$, $[CH_3(C_5H_4)_2]_2WH_2$, $(C_5H_5)W(Co)_3(CH_3)$, $W(butadiene)_3$, $W(methyl\ vinyl\ ketone)_3$, $(C_5H_5)HW(Co)_3$, $(C_7H_8)W(Co)_3$, etc. These may be used alone or in combinations thereof. The purge gas may use an inert gas having high chemical stability such as helium (He), neon (Ne), argon (AO, xenon (Xe) and nitrogen ($N_2$). The hydrogen source gases, which are deoxidizing agents of the ALD process, may include $H_2$, $Si_2H_6$, $B_2H_6$ and $SiH_4$, etc. These may also be used alone or in combinations thereof. Periodical repetition of the steps of a) supplying the metal source gases, b) supplying the purge gases, c) supplying the hydrogen source gases and d) supplying the purge gases may allow the first metal layer to have a proper thickness for a surface of the pattern.

While the present example embodiment discloses the first metal layer is formed on the pattern by the ALD process, any other processes for forming a thin layer on the pattern such as a metal plasma process and a pulsed nucleation layer (PNL) process may be utilized in place of the ALD process, as would be known to one of ordinary skill in the art. When the metal plasma process may be utilized in place of the ALD process, the metal source gases may be transformed into metal plasma by the electric power source 742 and a bias power is applied to the lower electrode 730 on which the substrate S is positioned by the bias power source 744. Accordingly, the metal plasma may be accelerated onto the surface of the pattern, and thus the first metal layer is uniformly formed along a profile of the contact hole in the pattern.

When the first unit process may be completed in the first section 700a and thus the first metal layer may be formed on the substrate S, the substrate S may be transferred onto the second lower electrode 730b of the second unit process section 700b adjacent to the first unit process section 700a by the transfer unit 732. While the substrate S may be transferred from the first section 700a to the second section 700b, the first section 700a may be depressurized from the first process pressure to the first exhaust pressure and thus first residuals may be discharged from the first section 700a to thereby complete a first cleaning process in the first section 700a (step S510).

In an example embodiment, when the first unit process may be finished in the first section 700a and the substrate S may be transferred to the second section 700b, the first pump system 620a may be operated and the first process pressure of the first section 700a may be decreased to the first exhaust pressure that is much less than a surrounding pressure of the process chamber 600. Therefore, the source gases that are not reacted in the first section 700a and the byproducts of the first unit process may be discharged from the first section 700a to thereby perform the first cleaning process in the first section 700a. Thus, the next first unit process may be performed with much less defects or failures in the first section 700a. For example, the first pump system 620a may control the first exhaust pressure in a range of about 0.01 mTorr to about 3 mTorr.

In the present example embodiment, the first process pressure may be decreased to the first exhaust pressure via a first buffer pressure between the first process pressure and the first exhaust pressure in the first section 700a, to thereby prevent rapid pressure decrease in the first section 700a.

In the second section 700b, the second unit process may be performed under a second process pressure to thereby process the first metal layer (step S430).

In an example embodiment, the second unit process may include an additional metal deposition process to the first metal layer, a modification process to the first meal layer or an etching process to the first metal layer. In the present example embodiment, the second unit process may include a nitration process for partially nitrifying the first metal layer. In case that the second unit process may be substantially the same as the first unit process, the process conditions of the second section 700b may be substantially the same as those of the first section 700a, and thus any further descriptions on the process conditions will be omitted. Hereinafter, the nitration process against the first metal layer may be exemplarily described in detail as the second unit process in the second section 700b.

For example, the inner pressure of the second section 700b may be controlled to the second pressure of about 0.1 Torr to about 10 Torr, and the substrate S may be heated to a temperature of about 300° C. to about 700° C. Nitrogen source gases may be supplied into the second plasma space 602b of the second section 700b by the second gas supplier 710b and may be transformed into nitrogen plasma by the second electric power source 742b. For example, the electric power of about 1.3 MeV may be applied to the second upper electrode 721b by the second electric power source 742b and nitrogen gas or ammonium gas may be utilized as the nitrogen source gases. The second lower electrode 730b on which the substrate S is positioned may move upwards to the upper electrode 720b to thereby reduce the size of the second plasma space 602b. Therefore, a plasma sheath in the second plasma space 602b only makes contact with the surface of the substrate S in the second section 700b without any contact with any other substrates in other unit process sections in the process chamber 600. Particularly, the nitration process to the first metal layer may be efficiently controlled by adjusting the bias power source 744b to the second lower electrode 730b.

While the present example embodiment discloses the partially nitrated metal layer may be formed by a plasma process using nitrogen source gases, any other processes such as an additional heat treatment may be utilized for the partial nitration to the first metal layer. For example, the heat treatment to the substrate S at a temperature of about 300° C. to about 950° C. in nitrogen ambient may cause the upper portion of the first metal layer adjacent to the upper surface of the pattern to be nitrated in place of the nitrogen plasma process.

When the second unit process may be completed in the second section 700b and thus the partially nitrated first metal layer may be formed on the substrate S, the substrate S may be transferred onto the third lower electrode 730c of the third unit process section 700c adjacent to the second unit process section 700b by the transfer unit 780. While the substrate S may be transferred from the second section 700b to the third section 700c, the second section 700b may be depressurized from the second process pressure to the second exhaust pressure and thus second residuals may be discharged from the second section 700b to thereby complete a second cleaning process in the second section 700a (step S520).

In an example embodiment, when the second unit process may be finished in the second section 700b and the substrate S may be transferred to the third section 700c, the second pump system 620b may be operated and the second process pressure of the second section 700b may be decreased to the second exhaust pressure that is much smaller than the surrounding pressure of the process chamber 600. Therefore, the source gases that are not reacted in the second section 700b and the byproducts of the second unit process may be discharged from the second section 700b to thereby perform the second cleaning process in the second section 700b. Thus, the next second unit process may be performed with much less defects or failures in the second section 700b. For example, the second pump system 620b may control the second exhaust pressure in a range of about 0.01 mTorr to about 3 mTorr.

In the present example embodiment, the second process pressure may be decreased to the second exhaust pressure via a second buffer pressure between the second process pressure and the second exhaust pressure in the second section 700b, to thereby prevent rapid pressure decrease in the second section 700b.

In the third section 700c, the third unit process may be performed under a third process pressure to thereby form a metal nitride layer on the first metal layer (step S440).

In an example embodiment, the third unit process may include a deposition process for forming the metal nitride layer on the first metal layer or for forming the metal nitride layer on a modified first metal layer. In the present example embodiment, the third unit process may include the deposition process for forming the metal nitride layer on the first metal layer.

For example, the metal nitride layer may include a tungsten nitride (WN) layer formed by an ALD process. The inner pressure of the third section 700c may be controlled to a third process pressure of about 0.1 Torr to about 350 Torr and the substrate S may be heated to a temperature of about 250° C. to about 550° C. in the third section 700c.

Metal source gases, purge gases, hydrogen source gases and nitrogen source gases may be supplied into the third processing unit 700c by the third gas supplier 710c, and thus the metal nitride layer is formed on the partially nitrated first metal layer along the profile of the contact hole. The metal source gases may include tungsten (W) precursors. Examples of the tungsten (W) precursors may include one of $WF_6$, $WCl_5$, $WBr_6$, $WCo_6$, $W(C_2H_2)_6$, $W(PF_3)_6$, $W(allyl)_4$, $(C_2H_5)WH_2$, $[CH_3(C_5H_4)_2]_2WH_2$, $(C_5H_5)W(Co)_2$, $(CH_3)$, W(butadiene)$_3$, W(methyl vinyl ketone)$_3$, $(C_5H_5)HW(Co)_3$, $(C_7H_8)W(Co)_3$, etc. These may be used alone or in combinations thereof. The purge gas may use an inert gas having high chemical stability such as helium (He), neon (Ne), argon (AO, xenon (Xe) and nitrogen ($N_2$). The hydrogen source gases, which are deoxidizing agents of the ALD process, may include $H_2$, $Si_2H_6$, $B_2H_6$ and $SiH_4$, etc. These may also be used alone or in combinations thereof. The nitrogen source gases may include nitrogen gas or ammonium gas.

Accordingly, the metal nitride layer is formed on the partially nitrated first metal layer along the profile of the contact hole by the ALD process. The metal nitride layer may be formed by the metal plasma process, the PNL process or a cyclic CVD process as well as the ALD process, as would be known to one of ordinary skill in the art.

When the third unit process may be completed in the third section 700c and thus the metal nitride layer may be formed on the partially nitrated first metal layer, the substrate S including the metal nitride layer may be transferred onto the fourth lower electrode 730d of the fourth unit process section 700d adjacent to the third unit process section 700c by the transfer unit 780. While the substrate S may be transferred from the third section 700c to the fourth section 700d, the third section 700c may be depressurized from the third process pressure to the third exhaust pressure and thus third residuals may be discharged from the third section 700c to thereby complete a third cleaning process in the third section 700a (step S530).

In an example embodiment, when the third unit process may be finished in the third section 700c and the substrate S may be transferred to the fourth section 700d, the third pump system 620c may be operated and the third process pressure of the third section 700c may be decreased to the third exhaust pressure that is much smaller than the surrounding pressure of the process chamber 600. Therefore, the source gases that are not reacted in the third section 700c and the byproducts of the third unit process may be discharged from the third section 700c to thereby perform the third cleaning process in the third section 700c. Thus, the next third unit process may be performed with much less defects or failures in the third section 700c. For example, the third pump system 620c may control the third exhaust pressure in a range of about 0.01 mTorr to about 3 mTorr.

In the present example embodiment, the third process pressure may be decreased to the third exhaust pressure via a third buffer pressure between the third process pressure and the third exhaust pressure in the third section 700c, to thereby prevent rapid pressure decrease in the third section 700c.

In the fourth section 700d, the fourth unit process may be performed under a fourth process pressure to thereby form a second metal layer on the metal nitride layer (step S450). The second metal layer may be formed into a metal plug, enclosed by the metal nitride layer.

For example, the inner pressure of the fourth section 700d may be controlled to a fourth process pressure of about 10 Torr to about 350 Torr and the substrate S may be heated to a temperature of about 250° C. to about 550° C. in the fourth section 700d. The second metal layer may include a tungsten (W) layer formed by one of an ALD process, a metal plasma process, a PNL process and a CVD process.

In an example embodiment, metal source gases, deoxidizing agents and carrier gases may be supplied into the fourth section 700d by the fourth gas supplier 710d, and thus the second metal layer may be formed on the metal nitride layer to a sufficient thickness to fill up the contact hole.

When the fourth unit process may be completed in the fourth section 700d and thus the second metal layer may be formed on the metal nitride layer, the substrate S including the second metal layer may be transferred into a next process chamber (not shown) in which a planarization process may be performed by the transfer unit 780. While the substrate S may be transferred from the fourth section 700d to the next process chamber, the fourth section 700d may be depressurized from the fourth process pressure to the fourth exhaust pressure and thus fourth residuals may be discharged from the fourth section 700d to thereby complete a fourth cleaning process in the fourth section 700d (step S540).

In an example embodiment, when the fourth unit process may be finished in the fourth section 700d and the substrate S may be transferred to the next process chamber, the fourth pump system 620d may be operated and the fourth process pressure of the fourth section 700d may be decreased to the fourth exhaust pressure that is much smaller than the surrounding pressure of the process chamber 600. Therefore, the source gases that are not reacted in the fourth section 700d and the byproducts of the fourth unit process may be discharged from the fourth section 700d to thereby perform the fourth cleaning process in the fourth section 700d. Thus, the next fourth unit process may be performed with much less defects or failures in the fourth section 700c. For example, the fourth pump system 620d may control the fourth exhaust pressure in a range of about 0.01 mTorr to about 3 mTorr.

In the present example embodiment, the fourth process pressure may be decreased to the fourth exhaust pressure via a fourth buffer pressure between the fourth process pressure and the fourth exhaust pressure in the fourth section 700d, to thereby prevent rapid pressure decrease in the fourth section 700d.

While the above example embodiment discloses the first to fourth unit processes may be performed on the same substrate in a sequential order at the first to fourth sections of the process chamber, the first to fourth unit processes may be performed on different substrates simultaneously at the first to fourth sections of the process chamber, because the first to fourth unit processes may be individually performed independently from one another in the single process chamber. Accordingly, the first to fourth cleaning processes may also be simultaneously performed at the first to fourth sections together with each other in the single process chamber.

Particularly, some of the unit process sections may function as a buffer section so as to coincide substrate transfer periods of each of the unit process sections in which different unit processes may be performed. For example, when the process time of the third unit process for forming the meta nitride layer may have twice as long as that of the first unit process for forming, the first metal layer, both of the second and the third sections may be utilized for forming the metal nitride layer after the formation of the first metal layer at the first unit process. In such a case, the substrates may be transferred from each of the unit process sections at the same time and the unit process for forming the metal nitride layer may be performed at two unit process sections and thus the transfer point of the substrate may coincide to the cleaning point of each unit process section.

The first to the fourth exhaust pressures may be identical to each other or may be different from each other in accordance with process conditions and environments, and thus the first to the fourth buffer pressure may be identical to each other or may be different from each other in accordance with process conditions and process environments. Particularly, when a single pump system may be connected to the process chamber, the first to the fourth exhaust pressures may be identical to each other. Thus, the pressure impact on the substrate caused by the pressure difference between the exhaust pressure and each of the process pressures may be decreased by the buffer pressures.

While the present example embodiment exemplarily discloses the single process chamber having four unit process sections in which the unit processes different from each other are performed independently from each other, the number of the unit process and the number of the unit process sections in the single process chamber may be varied in accordance with process conditions and environments and how many the buffer sections are needed.

Accordingly, the barrier layer and the metal plug enclosed by the barrier layer may be formed on the substrate in the same single process chamber without any alteration of the process chambers and thus the barrier layer and the metal layer may be formed without any defects caused by vacuum break at the alteration of process chambers. In addition, the cleaning process may be individually performed at each of the unit process sections of the single process chamber whenever the substrate may be transferred into the next unit process section, and thus the residuals of the source gases and byproducts of the respective unit process may be sufficiently discharged from each of the unit process sections of the single process chamber. Thus, the process defects of each of the process units may be sufficiently prevented in each of the unit process sections and the operation period of the apparatus 1000 may be sufficiently elongated, to thereby sufficiently increase the manufacturing efficiency in using the apparatus 1000.

According to the example embodiments of the present inventive concept, when a plurality of unit processes different from each other may be individually performed in the same single process chamber independently from each other, the cleaning process play also be individually performed at each of the unit process sections of the single process chamber whenever the substrate may be transferred into the next unit process section. Therefore, the process defects of the process units may be sufficiently prevented and the operation period of the apparatus 1000 may be sufficiently elongated, to thereby sufficiently increase the manufacturing efficiency in using the apparatus 1000.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    loading a substrate into a single process chamber having a plurality of unit process sections each section for performing a unit process in which a plurality of unit processes for manufacturing the semiconductor device are performed, respectively;
    performing the unit processes on the substrate independently from one another at the unit process sections under a respective process pressure, so that the substrate sequentially undergoes the unit processes at the respective unit process section of the process chamber, wherein a size of a plasma space in each unit process section is reduced during performance of a respective unit process such that a plasma sheath only makes contact with a surface of the substrate in the respective unit process section; and sequentially performing a cleaning process of each of the unit process sections, wherein a unit process section is individually subjected to the cleaning process after the substrate is transferred from the respective unit process section.

2. The method of claim 1, wherein performing the cleaning process to the unit process section includes:

reducing the process pressure to an exhaust pressure lower than the process pressure at each of the unit process sections; and discharging a residual of source gases and byproducts of the unit processes from each unit process section.

3. The method of claim 2, wherein the process pressure is in a range of about 0.1 Torr to about 350 Torr and the exhaust pressure is in a range of about 0.01 mTorr and about 3 mTorr.

4. The method of claim 2, wherein reducing the process pressure to the exhaust pressure includes:

firstly changing the process pressure to a buffer pressure higher than the exhaust pressure; and secondly reducing the buffer pressure to the exhaust pressure.

5. The method of claim 4, wherein the process pressure, the, buffer pressure and the exhaust pressure are individually applied to each of the unit process sections by a pump system that is connected to each of the unit process sections.

6. The method device of claim 5, wherein the buffer pressure is in a range of about 0.5 mTorr to about 200 Torr.

7. The method of claim 1, wherein the substrate includes a plurality of conductive structures, an insulation interlayer covering the conductive structures and having a contact hole through which the conductive structures are partially exposed, and performing the unit processes includes:

performing a first unit process under a first process pressure at a first unit process section of the process chamber, to thereby form a first metal layer on a surface of the insulation interlayer and sidewalls and a bottom of the contact hole;

performing a second unit process under a second process pressure at a second unit process section of the process chamber, to thereby process the first metal layer;

performing a third unit process under a third process pressure at a third unit process section of the process chamber, to thereby form a metal nitride layer on the processed first metal layer; and performing a fourth unit process under a fourth process pressure at a fourth unit process section of the process chamber, to thereby form a second metal layer on the metal nitride layer to a thickness to fill up the contact hole.

8. The method of claim 7, wherein the second unit process includes a nitration process for partially nitrating the first metal layer and an etching process for partially etching the first metal layer.

9. The method of claim 7, wherein performing the cleaning process includes:

reducing the first process pressure to a first exhaust pressure at the first unit process section after the substrate is transferred to the second unit process section after the first unit process is finished at the first unit process section;

reducing the second process pressure to a second exhaust pressure at the second unit process section after the substrate is transferred to the third unit process section after the second unit process is finished at the second unit process section;

reducing the third process pressure to a third exhaust pressure at the third unit process section after the substrate is transferred to the fourth unit process section after the third unit process is finished at the third unit process section; and reducing the fourth process pressure to a fourth exhaust pressure at the fourth unit process section after the substrate is unloaded from the process chamber after the fourth unit process is finished at the fourth unit process section.

10. The method of claim 9, wherein the first to the fourth exhaust pressures are substantially identical to one another and each of the process pressures are simultaneously reduced to the exhaust pressure at each of the unit process sections of the process chamber.

11. The method of claim 1, wherein each unit process section comprises an upper electrode and a lower electrode, wherein the substrate is positioned on the lower electrode, and wherein the size of a plasma space is reduced in each unit process section by moving the lower electrode upwardly towards the upper electrode.

* * * * *